(12) United States Patent
Yang et al.

(10) Patent No.: US 12,183,833 B2
(45) Date of Patent: Dec. 31, 2024

(54) FLASH MEMORY DEVICE

(71) Applicant: Winbond Electronics Corp., Taichung (TW)

(72) Inventors: Cheng-Ta Yang, Kaohsiung (TW); Lu-Ping Chiang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/592,832

(22) Filed: Feb. 4, 2022

(65) Prior Publication Data
US 2022/0157993 A1    May 19, 2022

Related U.S. Application Data

(62) Division of application No. 16/823,800, filed on Mar. 19, 2020, now Pat. No. 11,289,612.

(30) Foreign Application Priority Data

Mar. 19, 2019 (TW) .................. 108109234

(51) Int. Cl.
*H01L 21/00* (2006.01)
*H01L 21/28* (2006.01)
(Continued)

(52) U.S. Cl.
CPC .... *H01L 29/7883* (2013.01); *H01L 29/40114* (2019.08); *H01L 29/42324* (2013.01);
(Continued)

(58) Field of Classification Search
CPC .......... H01L 29/7883; H01L 29/40114; H01L 29/42324; H01L 29/42364; H01L 29/4916; H01L 29/66825; H10B 41/42; H10B 41/40
See application file for complete search history.

(56) References Cited

U.S. PATENT DOCUMENTS 4,764,478 A * 8/1988 Hiruta ............... H01L 21/32155
438/585
4,975,383 A * 12/1990 Baglee ............... G11C 16/0441
438/258
(Continued)

FOREIGN PATENT DOCUMENTS

CN         105977254 A     9/2016
TW         201330182 A     7/2013

*Primary Examiner* — Richard A Booth
(74) *Attorney, Agent, or Firm* — MUNCY, GEISSLER, OLDS & LOWE, P.C.

(57) ABSTRACT

A flash memory device is provided. The flash memory device includes a substrate, a first dielectric layer, a second dielectric layer, a third dielectric layer, a first polycrystalline silicon layer and a second polycrystalline silicon layer. The first dielectric layer is formed on the substrate located in a first region of a peripheral region, the second dielectric layer is formed on the substrate located in a second region of the peripheral region, and the third dielectric layer is formed on the substrate located in an array region. A bottom surface of the third dielectric layer is lower than a bottom surface of the second dielectric layer. The first polycrystalline silicon layer is formed on the first and the second dielectric layers. The second polycrystalline silicon layer is formed on the third dielectric layer.

17 Claims, 8 Drawing Sheets

(51) Int. Cl.
*H01L 29/423* (2006.01)
*H01L 29/49* (2006.01)
*H01L 29/66* (2006.01)
*H01L 29/788* (2006.01)
*H10B 41/30* (2023.01)
*H10B 41/40* (2023.01)
*H10B 41/42* (2023.01)
*H10B 41/49* (2023.01)

(52) U.S. Cl.
CPC .... *H01L 29/42364* (2013.01); *H01L 29/4916* (2013.01); *H01L 29/66825* (2013.01); *H10B 41/30* (2023.02); *H10B 41/40* (2023.02); *H10B 41/42* (2023.02); *H10B 41/49* (2023.02)

(56) References Cited

U.S. PATENT DOCUMENTS

| | | | |
|---|---|---|---|
| 4,997,777 A * | 3/1991 | Boivin | H01L 29/66636 257/E29.267 |
| 5,104,819 A * | 4/1992 | Freiberger | H01L 29/40114 257/E21.209 |
| 5,254,489 A | 10/1993 | Nakata | |
| 5,591,681 A | 1/1997 | Wristers et al. | |
| 5,658,812 A | 8/1997 | Araki | |
| 6,004,847 A | 12/1999 | Clementi et al. | |
| 6,110,842 A * | 8/2000 | Okuno | H01L 21/28185 438/770 |
| 6,309,928 B1 * | 10/2001 | Sung | H10B 69/00 438/257 |
| 7,416,945 B1 * | 8/2008 | Muralidhar | H10B 69/00 438/257 |
| 7,482,223 B2 | 1/2009 | Higashitani et al. | |
| 7,816,211 B2 * | 10/2010 | Rao | H01L 29/7887 438/257 |
| 7,820,504 B2 | 10/2010 | Brazzelli et al. | |
| 2002/0045303 A1 | 4/2002 | Lee | |
| 2014/0151778 A1 | 6/2014 | Purayath et al. | |
| 2014/0162417 A1 | 6/2014 | Utsuno | |
| 2022/0181329 A1 * | 6/2022 | Choi | H10B 12/34 |

\* cited by examiner

FLASH MEMORY DEVICE

CROSS REFERENCE TO RELATED APPLICATIONS

This Application is a Divisional of U.S. patent application Ser. No. 16/823,800, field Mar. 19, 2020 and entitled "FLASH MEMORY DEVICE AND METHOD FOR MANUFACTURING THE SAME", which claims priority of Taiwan Patent Application No. 108109234, filed on Mar. 19, 2019, the entirety of which is incorporated by reference herein.

BACKGROUND

Field of the Disclosure

The present disclosure relates to a memory device, and in particular it relates to a flash memory device and a method for manufacturing the flash memory device.

Description of the Related Art

In the production of a flash memory device, oxide layers of different thickness may be formed in different regions of a single wafer using a multiple oxidation process. Depending on the thickness of the oxide layer, each region may correspond to a different operating voltage. As a result, the flexibility of circuit design is increased, and the product value is improved.

However, using an existing multiple oxidation process, the dopant included in the floating gate may enter the tunneling dielectric layer or penetrate through the tunneling dielectric layer and into the substrate, resulting in operational errors. Therefore, the yield and reliability of the flash memory device are reduced.

Therefore, in the technical field of flash memory devices, there is still a need for improved reliability and yield.

BRIEF SUMMARY

The embodiments of the present invention provide a flash memory device and a method for manufacturing the same, which can prevent the dopant from penetrating through the dielectric layer. Therefore, the reliability of the tunneling dielectric layer can be maintained, and the uniformity of thickness of the tunneling dielectric layer can be improved.

The disclosure provides a flash memory device. The flash memory device includes a substrate, a first dielectric layer, a second dielectric layer, a third dielectric layer, a first polycrystalline silicon layer, and a second polycrystalline silicon layer. The substrate includes an array region and a peripheral region. The peripheral region includes a first region and a second region. The first dielectric layer is formed on the substrate in the first region. The second dielectric layer is formed on the substrate in the second region. The third dielectric layer is formed on the substrate in the array region. The bottom surface of the third dielectric layer is lower than the bottom surface of the second dielectric layer. The first polycrystalline silicon layer is formed on the first dielectric layer and the second dielectric layer, and the first polycrystalline silicon layer includes a first dopant. The second polycrystalline silicon layer is formed on the third dielectric layer, and the second polycrystalline silicon layer includes a second dopant.

According to the manufacturing method of the flash memory device provided by the embodiments of the present invention, the problems of the penetration of the dopants or the uneven thickness of the oxide layer in the triple oxidation process can be avoided. Therefore, the yield and reliability of the flash memory device can be significantly improved.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
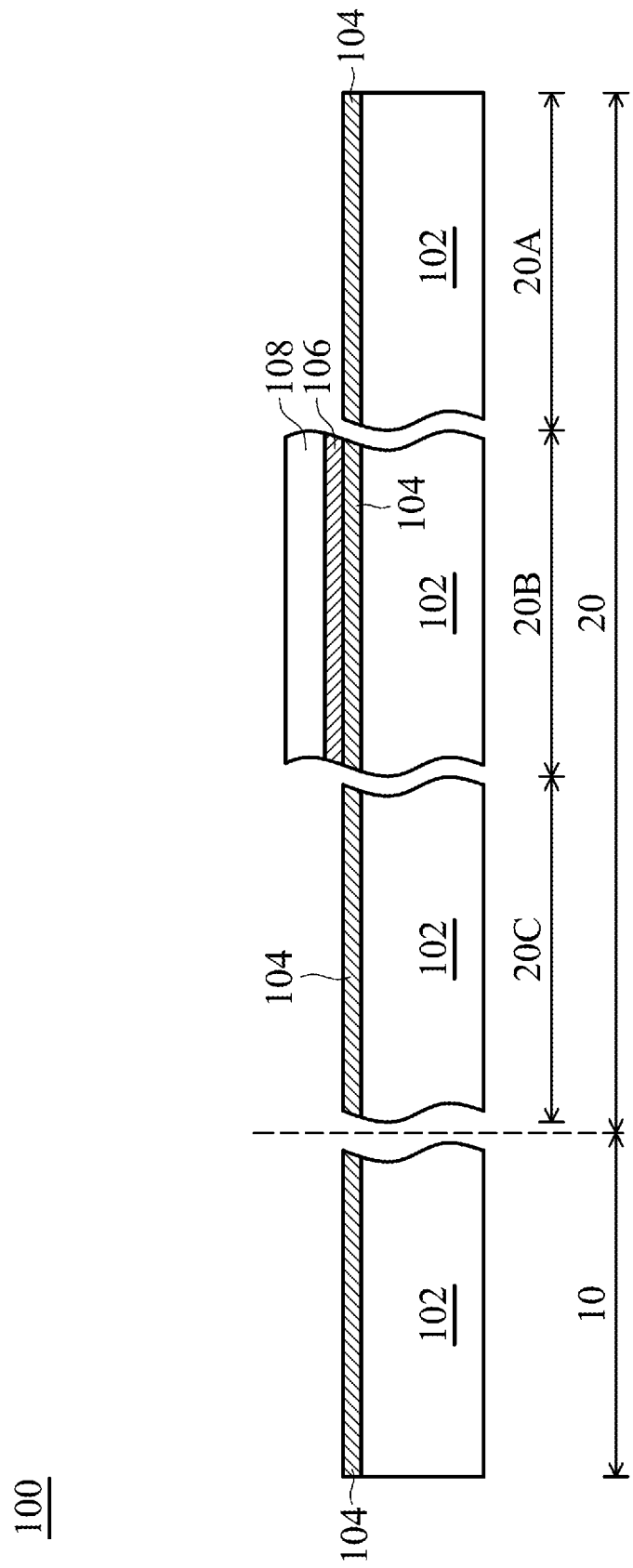
FIGS. 1A-1H are cross-sectional views corresponding to various steps of manufacturing a flash memory device in accordance with some embodiments.

It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

The embodiments of the present invention provide a flash memory device and a method for manufacturing the same. FIGS. 1A-1H are cross-sectional views corresponding to various steps of manufacturing a flash memory 100 device in accordance with some embodiments.

Referring to FIG. 1A, a sacrificial layer 104 is formed on a substrate 102. The substrate 102 may include an array region 10 and a peripheral region 20 adjacent to the array region 10. The peripheral region 20 may include multiple regions corresponding to different operating voltages. In some embodiments, the peripheral region 20 includes a first region 20A, a second region 20B, and a third region 20C. It should be noted that the sizes and arrangement of the first region 20A, the second region 20B, and the third region 20C illustrated in FIG. 1A are merely for illustrative purposes and is not intended to limit the disclosure.

In some embodiments, the substrate 102 is a semiconductor substrate. In some embodiments, the material of the substrate 102 may include silicon, gallium arsenide, gallium nitride, silicon germanium, silicon on insulator (SOI), other suitable materials, or a combination thereof. In the present embodiment, the substrate 102 is a silicon substrate. In some embodiments, other structures may also be formed in the substrate 102. For example, a p-type well region, an n-type well region or a conductive region (not shown) may be formed in the substrate 102 by the implantation process.

The material of the sacrificial layer 104 may be an oxide. In some embodiments, the sacrificial layer 104 can be formed by oxidizing the surface of the substrate 102 by a thermal oxidation process. In other embodiments, the sacrificial layer 104 can be formed on the substrate 102 by a suitable deposition process. In the present embodiment, the sacrificial layer 104 is formed before performing the aforementioned implantation process, thereby protecting the surface of the substrate 102 from damage.

Next, a pad nitride layer 106 is formed on the sacrificial layer 104, and a mask layer 108 is formed on the pad nitride layer 106. Afterwards, the mask layer 108 is patterned and the pad nitride layer 106 is partially removed by the patterned mask layer 108. The pad nitride layer 106 located in the second region 20B is retained, and the pad nitride layer 106 located in the array region 10, the first region 20A, and the third region 20C are removed. Because the removal of the pad nitride layer 106 has a selectivity ratio respect to the sacrificial layer 104, the sacrificial layer 104 can serve as an etch stop layer when the pad nitride layer 106 is removed.

Figure 1B:
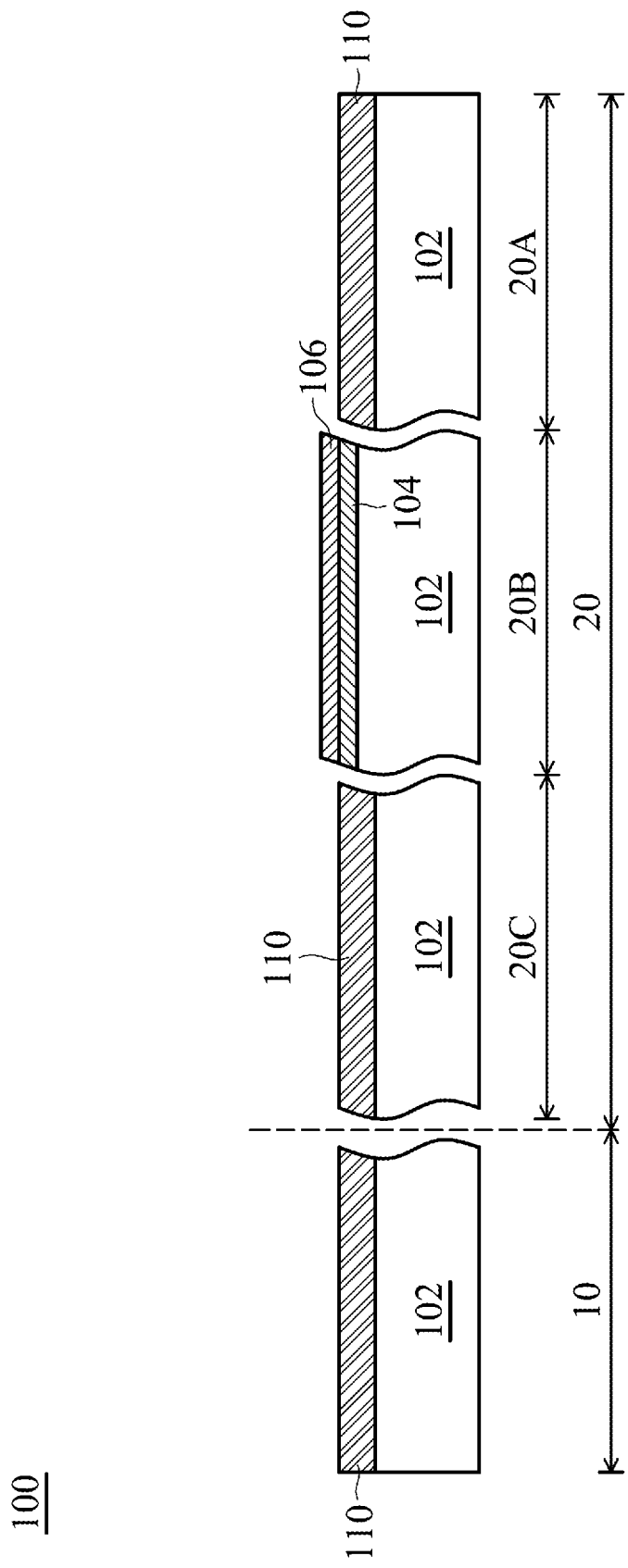

Referring to FIG. 1B, the sacrificial layer 104 located in the array region 10, the first region 20A, and the third region 20C is removed to expose the substrate 102 in the array region 10, the first region 20A, and the third region 20C. Next, a first dielectric layer 110 is formed on the substrate 102 in the array region 10, the first region 20A, and the third region 20C. In the present embodiment, the first dielectric layer 110 can be formed by oxidizing the surface of the substrate 102 by a first thermal oxidation process (for example, a furnace process). Thereby, the top surface of the substrate 102 in the array region 10, the first region 20A and the third region 20C is lower than the top surface of the substrate 102 in the second region 20B. In the present embodiment, when the sacrificial layer 104 is removed, the removal condition having a selectivity ratio respect to the pad nitride layer 106 can be selected, whereby the pad nitride layer 106 can serve as a protective layer, and the sacrificial layer 104 located in the region 20B is retained.

Figure 1C:
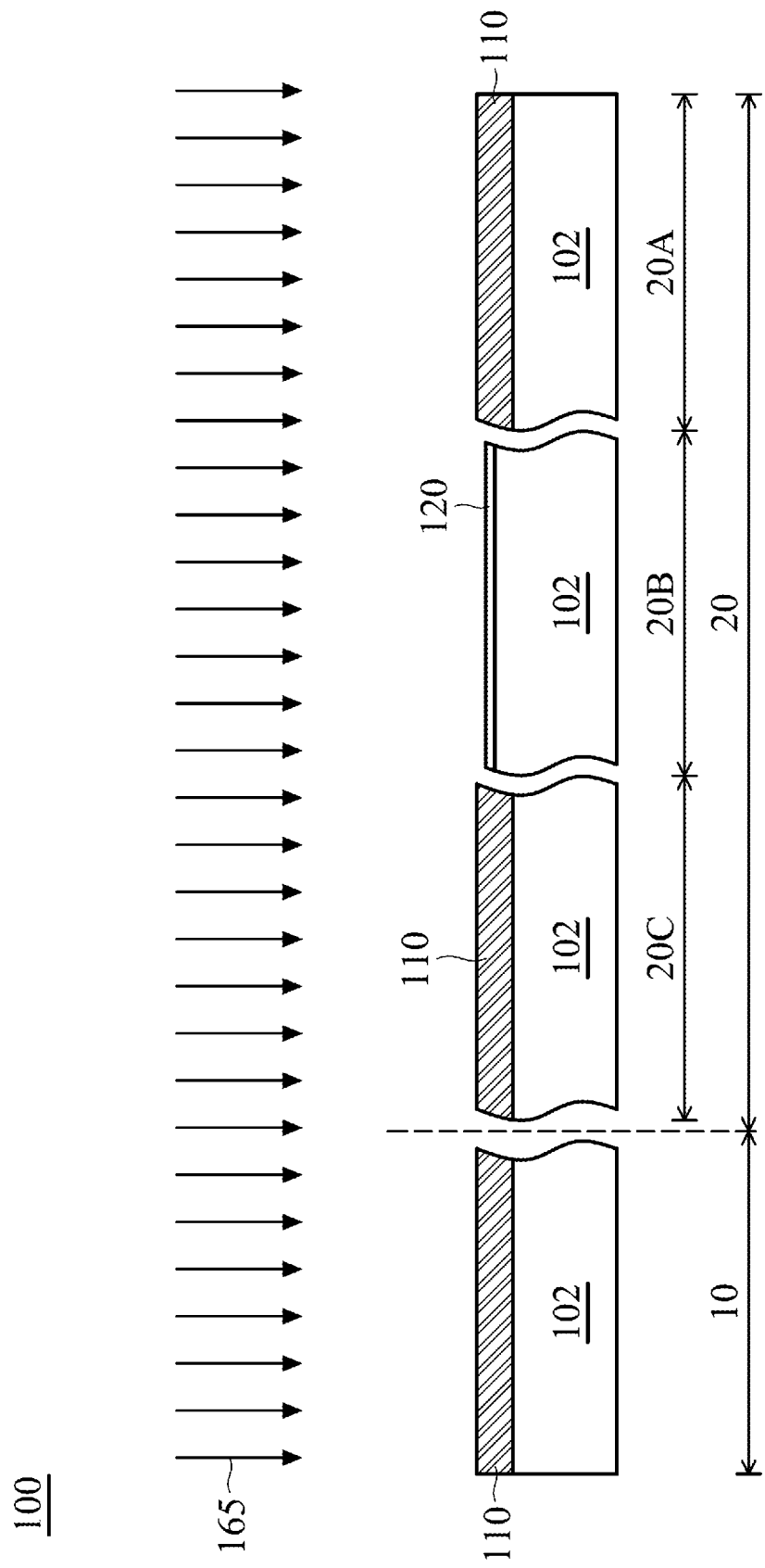

Referring to FIG. 1C, the pad nitride layer 106 and the sacrificial layer 104 located in the second region 20B are removed to expose the substrate 102 in the second region 20B. Next, a second dielectric layer 120 is formed on the substrate 102 in the second region 20B. The thickness of the second dielectric layer 120 is less than the thickness of the first dielectric layer 110. In the present embodiment, the surface of the substrate 102 can be oxidized by a second thermal oxidation process to form the second dielectric layer 120. After the second dielectric layer 120 is formed, a first nitridation process 165 is performed on the first dielectric layer 110 and the second dielectric layer 120. The first nitridation process 165 may include a nitrogen oxide annealing (NO annealing) process, a plasma nitridation annealing (PNA) process, or a plasma nitridation (PN) process.

Figure 1D:
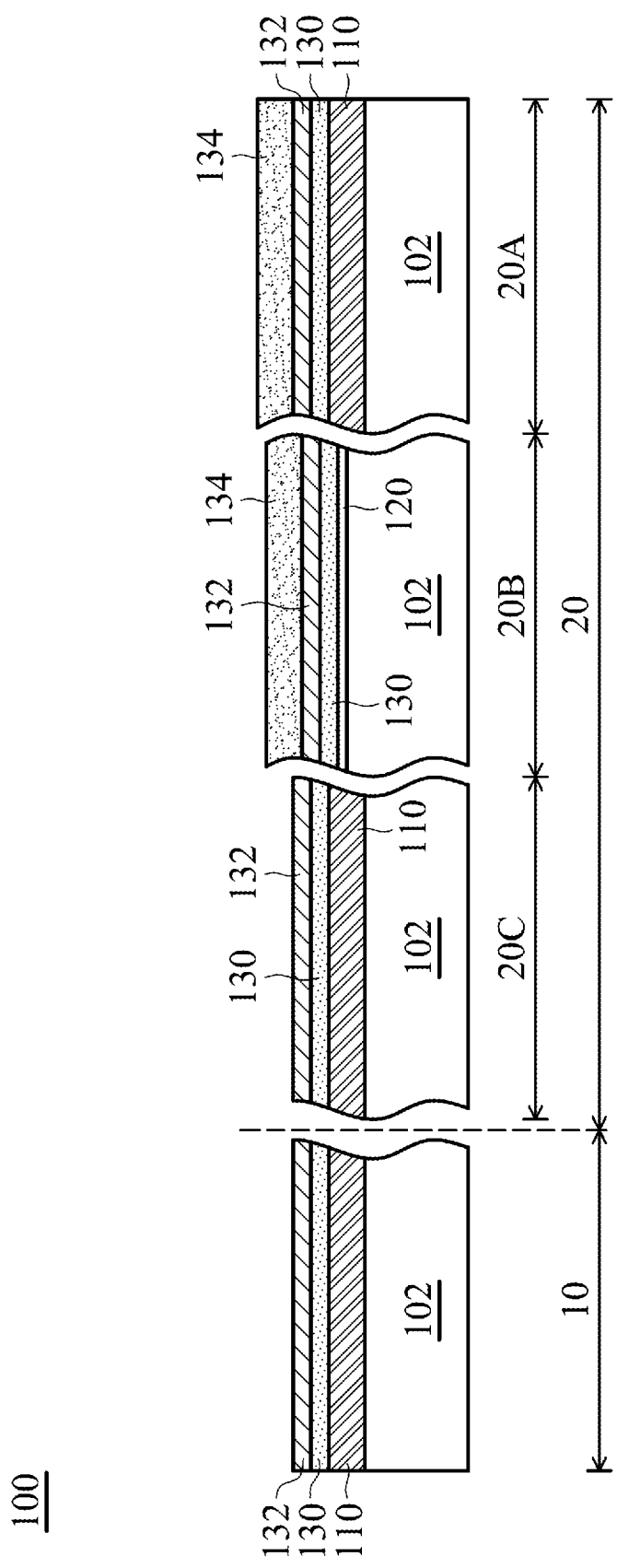

Referring to FIG. 1D, a first polycrystalline silicon layer 130 is formed on the first dielectric layer 110 and the second dielectric layer 120. Next, a nitride mask layer 132 and a photoresist layer 134 are sequentially formed on the first polycrystalline silicon layer 130. Thereafter, the photoresist layer 134 is patterned to expose the nitride mask layer 132 located in the array region 10 and the third region 20C.

In order to enhance the conductivity of the first polycrystalline silicon layer 130, the first polycrystalline silicon layer 130 may include a first dopant. Therefore, the first polycrystalline silicon layer 130 can be used as a floating gate or as another conductive element. In some embodiments, a polycrystalline silicon layer can be deposited, and then the first dopant can be doped into the polycrystalline silicon layer. In other words, the first polycrystalline silicon layer 130 is formed by ex-situ deposition. In the present embodiment, the polycrystalline silicon layer is formed by simultaneously depositing and doping with the first dopant. In other words, the first polycrystalline silicon layer 130 is formed by in-situ deposition. In the present embodiment, the time and cost of the deposition process can be reduced.

The first dopant may be a p-type dopant or an n-type dopant. More specifically, the first dopant may be boron, gallium, phosphorus, arsenic, or another suitable dopant. In the present embodiment, the first dopant is boron, and the first polycrystalline silicon layer 130 is a p-type floating gate. The p-type floating gate has better charge retention than the n-type floating gate. Therefore, the thickness of the floating gate and the tunneling dielectric layer can be made smaller, thereby facilitating miniaturization of the flash memory device. Furthermore, if a p-type floating gate is used, the write operation can be performed at a lower voltage. Therefore, the performance of the flash memory device can be improved.

Figure 1E:
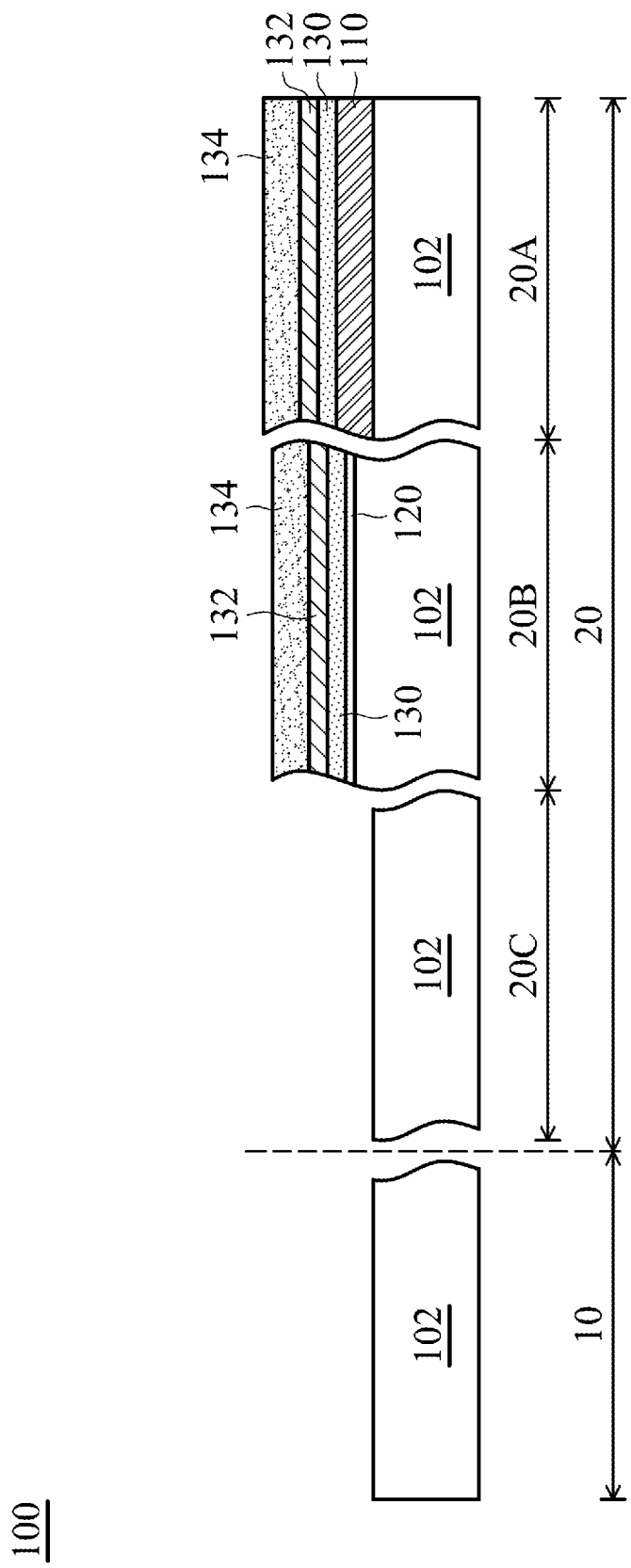

Referring to FIG. 1E, the nitride mask layer 132, the first polycrystalline silicon layer 130, and the first dielectric layer 110 located in the array region 10 and the third region 20C exposed by the patterned photoresist layer 134 are removed to expose the substrate 102 in the array region 10 and the third region 20C.

Figure 1F:
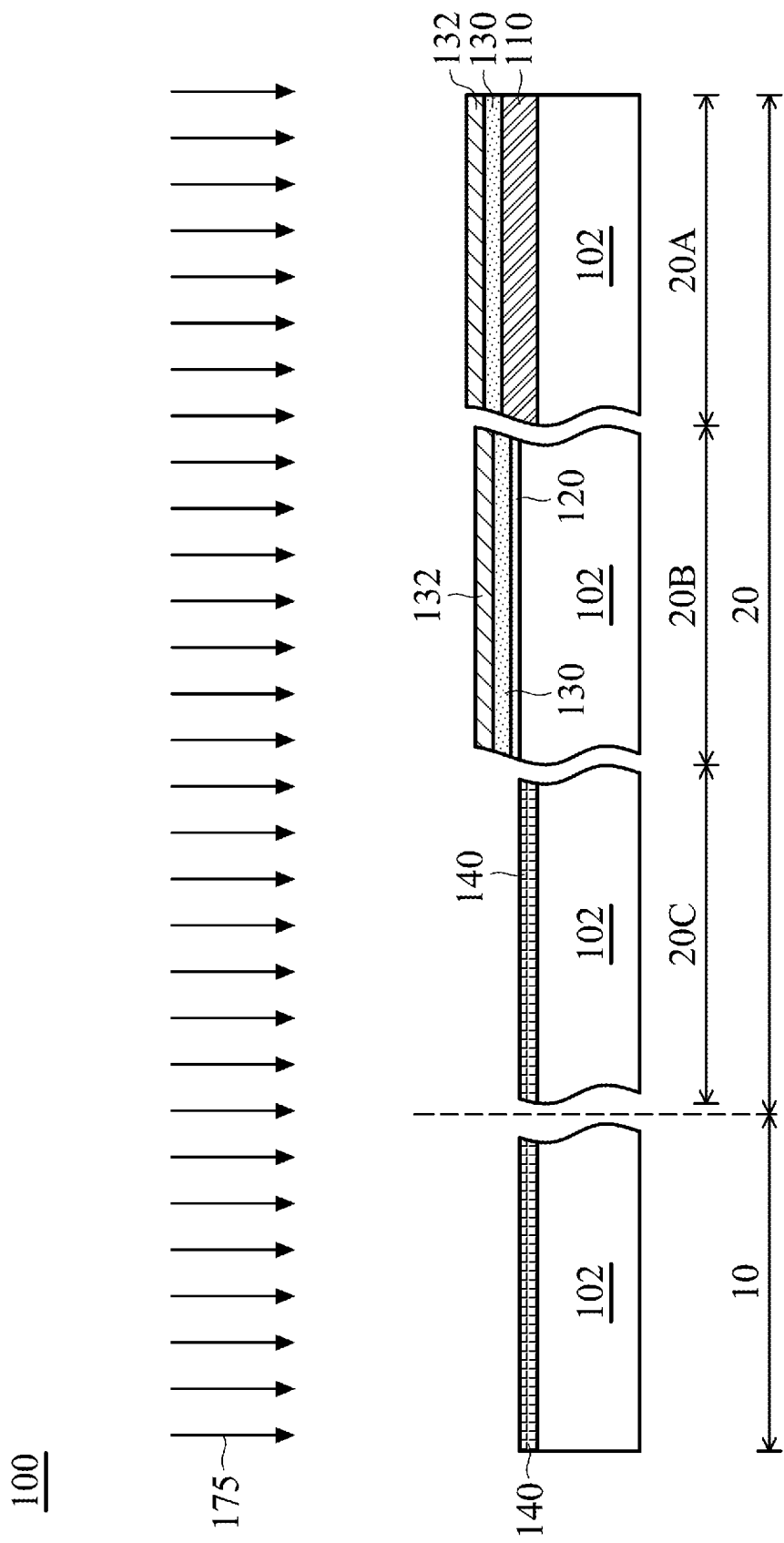

Referring to FIG. 1F, a third dielectric layer 140 is formed on the substrate 102 in the array region 10 and the third region 20C. In the present embodiment, the surface of the substrate 102 can be oxidized by a third thermal oxidation process to form the third dielectric layer 140. After forming the third dielectric layer 140, the second nitridation process 175 is performed on the third dielectric layer 140 located in the array region 10 and the third region 20C. The second nitridation process 175 may include a nitrogen oxide annealing process, a plasma nitridation annealing process, or a plasma nitridation process. In some embodiments, the second nitridation process 175 is the same as the first nitridation process 165, and therefore, the complexity of the process can be reduced. In other embodiments, the second nitridation process 175 is different from the first nitridation process 165.

Figure 1G:
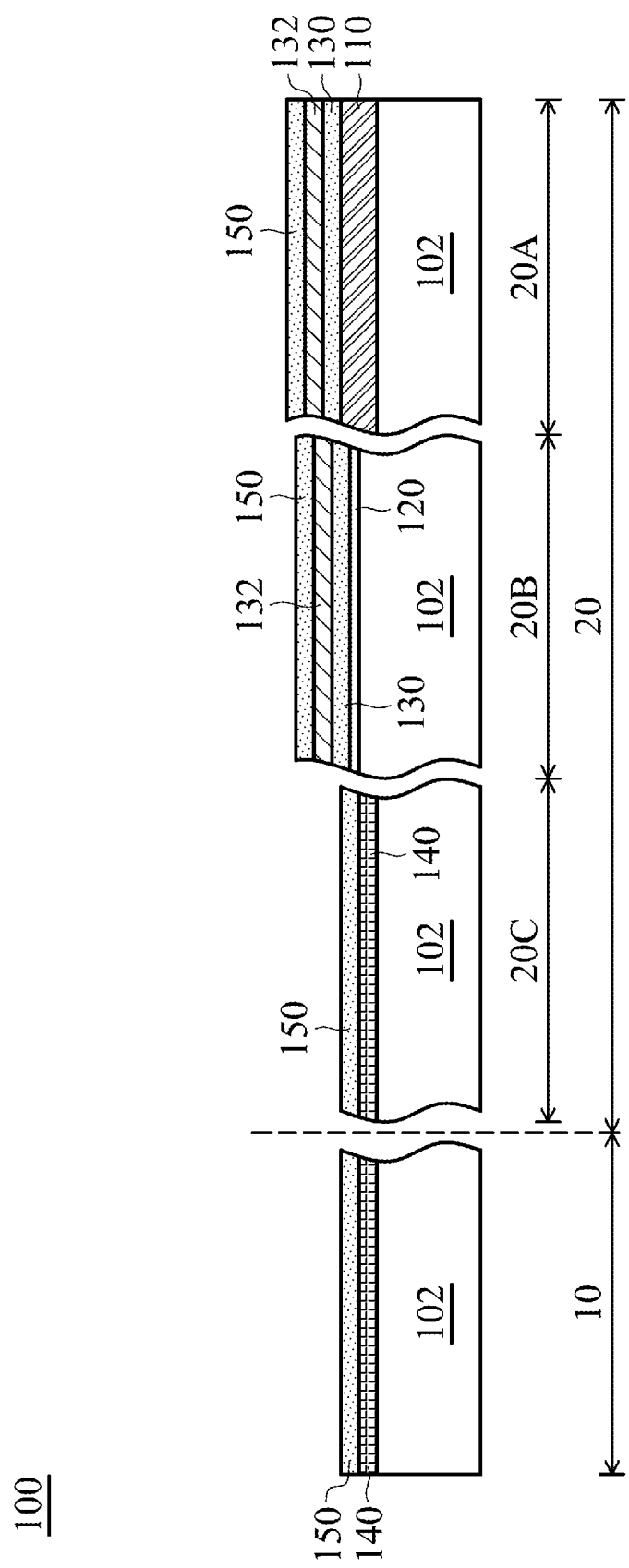

Referring to FIG. 1G, a second polycrystalline silicon layer 150 is formed on the third dielectric layer 140 and the nitride mask layer 132. In order to enhance the conductivity of the second polycrystalline silicon layer 150, the second polycrystalline silicon layer 150 may include a second dopant. Therefore, the second polycrystalline silicon layer 150 can be used as a floating gate or as another conductive element. The material and manufacturing process for forming the second polycrystalline silicon layer 150 may be the same as the material and manufacturing process for forming the first polycrystalline silicon layer 130, and will not be described in detail herein. Furthermore, the second dopant may be the same as or different from the first dopant. In the present embodiment, both the first dopant and the second dopant are boron, and the first polycrystalline silicon layer 130 and the second polycrystalline silicon layer 150 are p-type floating gates. A top surface of the first polycrystalline silicon layer 130 in the first region 20A is higher than a top surface of the first polycrystalline silicon layer 130 in the second region 20B. The top surface of the first polycrystalline silicon layer 130 in the second region 20B is higher than a top surface of the second polycrystalline silicon layer 150 in the third region 20C and the array region 10.

Figure 1H:
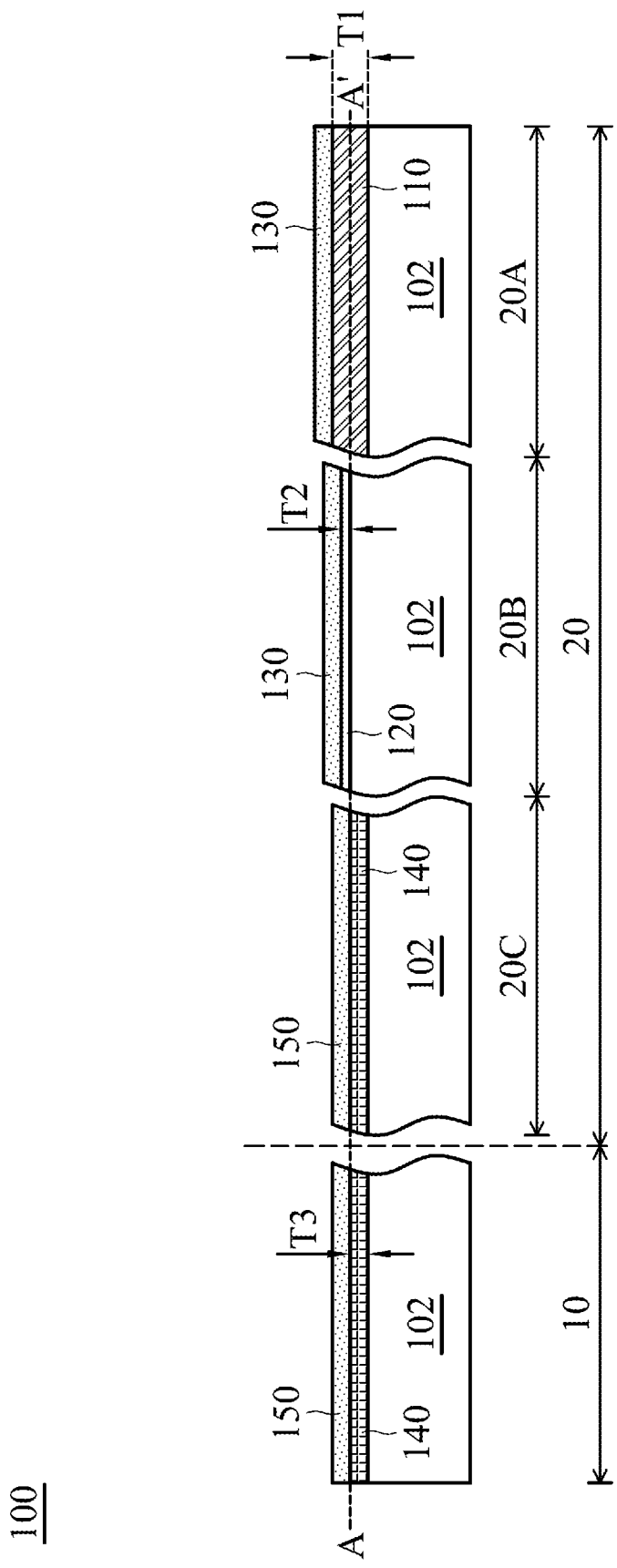

Referring to FIG. 1H, the nitride mask layer 132 and the second polycrystalline silicon layer 150 located in the first region 20A and the second region 20B are removed to expose the first polycrystalline silicon layer 130 in the first region 20A and the second region 20B. Thereafter, other conventional processes (for example, forming the control gates, patterning the floating gates, and patterning the control gates) may be performed to complete the flash memory device 100. These conventional processes will not be described in detail herein.

In some embodiments, the method for manufacturing a flash memory device includes a triple oxidation process whereby three dielectric layers having different thicknesses can be formed in different regions of the substrate. More specifically, referring to FIG. 1H, the first dielectric layer 110, the second dielectric layer 120, and the third dielectric layer 140 having different thicknesses are respectively foisted in the first region 20A, the second region 20B and third region 20C of the peripheral region 20. Furthermore, a third dielectric layer 140 is also formed in the array region 10. The third dielectric layer 140 located in the array region 10 can control the switching of the memory cell by the tunneling effect. Therefore, in the present specification, the third dielectric layer 140 located in the array region 10 is also referred to "tunneling dielectric layer".

When the thickness of the second dielectric layer 120 is less than the thickness of the first dielectric layer 110, and the second dielectric layer 120 is an oxide layer, the first dopant in the first polycrystalline silicon layer 130 may penetrate through the second dielectric layer 120 and into the substrate 102. Similarly, when the thickness of the third dielectric layer 140 is less than the thickness of the first dielectric layer 110, and the third dielectric layer 140 is an oxide layer, the second dopant in the second polycrystalline silicon layer 150 may penetrate through the third dielectric layer 140 and into the substrate 102. As a result, it will lead to operational errors and reduce the yield and reliability of the flash memory device. In the present embodiment, the first dopant is boron. Compared to other dopants, the volume of boron dopants is smaller, and the aforementioned problem of the penetration of the dopants will become more serious.

In order to solve the aforementioned problem of the penetration of the dopants, as shown in FIG. 1C and FIG. 1F, the oxide layer may be nitrided to form a thin nitride layer on the surface of the oxide layer, thereby blocking the dopant in the first polycrystalline silicon layer 130 and the second polycrystalline silicon layer 150 subsequently formed from entering the oxide layer or the substrate 102.

However, the aforementioned nitridation process may cause a portion of the nitrogen atoms to diffuse into the oxide layer, and may cause the surface of the substrate exposed by removing the nitrided oxide layer to be uneven, and may result in the tunneling dielectric layer subsequently formed having uneven thickness. For some flash memory devices (for example, NAND FLASH), the quality and the uniformity of the thickness of the tunneling dielectric layer in the array region are important conditions that affect the probability of tunneling. If the thickness of the tunneling dielectric layer in the array region is not uniform, electrons will tunnel from the region with the thinner dielectric layer. Therefore, damage and leakage current may occur in the region with the thinner dielectric layer, which may lead to operational errors. As a result, the yield, lifetime, and reliability of the flash memory device will decrease.

Referring to FIG. 1B, in the present embodiment, the first dielectric layer 110 is simultaneously formed in the array region 10, the first region 20A, and the third region 20C. The formation of the first dielectric layer 110 thicker than the second dielectric layer 120 prior to the first nitridation process 165 (as shown in FIG. 1C) can help prevent nitrogen atoms from accumulating on the surface of the substrate 102 during the subsequent nitridation process 165. Therefore, after the first dielectric layer 110 located in the array region 10 and the third region 20C is removed, the exposed surface of the substrate 102 is flat. Even if the thickness of the third dielectric layer 140 is small, the third dielectric layer 140 formed in the array region 10 and the third region 20C can have a substantially uniform thickness. In this way, the aforementioned problem of uneven thickness of the oxide layer can be avoided, and the lifetime and reliability of the flash memory device can be improved.

Similarly, because the third dielectric layer 140 is formed before the second nitridation process 175, even if a subsequent second nitridation process 175 causes a small amount of nitrogen atoms to exist on the surface of the substrate 102, this hardly affects the uniformity of the thickness of the formed third dielectric layer 140. As a result, the aforementioned problem of uneven thickness of the oxide layer can be avoided, and the lifetime and reliability of the flash memory device can be improved.

Furthermore, when the third dielectric layer 140 is an oxide layer, after the patterning of the floating gate, in order to repair the damage of the tunneling dielectric layer at the edge of the pattern, a thermal oxidation process is performed. However, the edge of the floating gate is also oxidized, and the bird's beak effect occurs. Due to the poor conductivity of the locally oxidized floating gate, the performance and yield of the flash memory device will be reduced. As the size is reduced, the effects of the bird's beak effect will become more serious. In the present embodiment, by performing the second nitridation process 175 on the third dielectric layer 140, oxygen in the third dielectric layer 140 can be prevented from entering the second polycrystalline silicon layer 150, and the bird's beak effect is reduced.

Some embodiments of the present invention provide a flash memory device 100. Referring to FIG. 1H, the flash memory device 100 includes a substrate 102. The substrate 102 includes an array region 10 and a peripheral region 20, and the peripheral region 20 includes a first region 20A, a second region 20B, and a third region 20C. The flash memory device 100 includes a first dielectric layer 110, a second dielectric layer 120, and a third dielectric layer 140 formed on the substrate 102. The first dielectric layer 110 is located in the first region 20A. The second dielectric layer 120 is located in the second region 20B. The third dielectric layer 140 is located in the array region 10 and the third region 20C. The flash memory device 100 includes a first polycrystalline silicon layer 130 and a second polycrystalline silicon layer 150. The first polycrystalline silicon layer 130 is formed on the first dielectric layer 110 and the second dielectric layer 120. The second polycrystalline silicon layer 150 is formed on the third dielectric layer 140. The first polycrystalline silicon layer 130 includes a first dopant, and the second polycrystalline silicon layer 150 includes a second dopant. At least one of the first dielectric layer 110, the second dielectric layer 120 and the third dielectric layer 140 is a nitrided oxide layer. In the present embodiment, each of the first dielectric layer 110, the second dielectric layer 120, and the third dielectric layer 140 is a nitrided oxide layer. At least one of the first dielectric layer 110, the second dielectric layer 120 and the third dielectric layer 140 includes an oxide layer and a nitride layer on the oxide layer. The first dielectric layer 110 includes a first nitride layer. The second dielectric layer 120 includes a second nitride layer. The first nitride layer and the second nitride layer are formed in the same process (e.g. both in the first nitridation process 165). The third dielectric layer 140 includes a third nitride layer. The third nitride layer and the first nitride layer are formed in different processes (e.g. in the second nitridation process 175 and the first nitridation process 165, respectively). In the present embodiment, both the first dopant and the second dopant are boron. In another embodiment, the first dielectric layer 110, the second dielectric layer 120, and the third dielectric layer 140 may include silicon nitride and/or a material having a high dielectric constant.

Referring to FIG. 1H, the dotted line AA' represents the top surface of the substrate 102 in the second region 20B or the bottom surface of the second dielectric layer 120. In the present embodiment, each of the top surfaces of the substrate 102 in the array region 10, the first region 20A, and the third region 20C is lower than the top surface of the substrate 102 in the second region 20B. In other words, both the bottom surface of the first dielectric layer 110 and the bottom surface of the third dielectric layer 140 are lower than the bottom surface of the second dielectric layer 120. In addition, in an embodiment which is not shown, the third dielectric layer 140 is formed by performing a thermal oxidation process on the substrate 102, so that the bottom surface of the third dielectric layer 140 is lower than the bottom surface of the first dielectric layer 110.

In the present embodiment, the first dielectric layer 110 located in the first region 20A has a first thickness T1. The second dielectric layer 120 located in the second region 20B has a second thickness T2. The third dielectric layer 140 located in the third region 20C and the array region 10 has a third thickness T3. The first thickness T1 is greater than the second thickness T2 and the third thickness T3. The third thickness T3 is greater than the second thickness T2. The thicker dielectric layer the region has, the higher the operating voltage of the region is. Therefore, the first operating voltage corresponding to the first region 20A is greater than the second operating voltage corresponding to the second region 20B, and is greater than the third operating voltage corresponding to the third region 20C and the array region 10. The third operating voltage is greater than the second operating voltage.

In some embodiments, the first thickness T1 of the first dielectric layer 110 is 10-40 nm to avoid the accumulation of nitrogen atoms on the surface of the substrate 102. In some embodiments, the third thickness T3 of the third dielectric layer 140 is 5-9 nm, thereby improving the performance and lifetime of the flash memory device 100. In some embodiments, the second thickness T2 of the second dielectric layer 120 is 1-4 nm, so that the peripheral region 20 can have the second operating voltage lower than the third operating voltage.

In the manufacturing method of the present embodiment, the first dielectric layer 110, the second dielectric layer 120, and the third dielectric layer 140 may be formed independently from each other. Furthermore, in the flash memory device 100 of the present embodiment, the peripheral region 20 includes three dielectric layers which have different thicknesses, and they can correspond to three different operating voltages. Therefore, the flexibility of circuit design is significantly increased.

In summary, the method for manufacturing a flash memory device according to the embodiments of the present invention can avoid the problem of the penetration of the dopants and the problem of uneven thickness of the oxide layer. Therefore, the yield, reliability, performance, and lifetime of the flash memory device can be significantly improved. Furthermore, the method for manufacturing the flash memory device provided by the embodiments of the present invention does not use an additional mask or development process. Therefore, it can be easily integrated into existing processes without affecting the time and cost required for production. Furthermore, dielectric layers of different regions may be formed independently from each other. Therefore, the process flexibility of the flash memory device can be significantly improved Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A flash memory device, comprising:
 a substrate, wherein the substrate comprises an array region and a peripheral region, and the peripheral region comprises a first region, a second region, and a third region;
 a first dielectric layer formed on the substrate in the first region of the peripheral region;
 a surface nitrided second dielectric layer formed on the substrate in the second region of the peripheral region, wherein a thickness of the first dielectric layer is greater than a thickness of the surface nitrided second dielectric layer;
 a third dielectric layer formed on the substrate in the array region and the third region of the peripheral region, wherein a bottom surface of the third dielectric layer is lower than a bottom surface of the surface nitrided second dielectric layer and a thickness of the third dielectric layer is greater than the thickness of the surface nitrided second dielectric layer;
 a first polycrystalline silicon layer formed on the first dielectric layer and the surface nitrided second dielectric layer, wherein the first polycrystalline silicon layer comprises a first dopant; and
 a second polycrystalline silicon layer formed on the third dielectric layer, wherein the second polycrystalline silicon layer comprises a second dopant,
 wherein the second polycrystalline silicon layer in the array region is a floating gate, a first operating voltage corresponding to the first region is greater than a third operating voltage corresponding to the third region of the peripheral region and the array region, and the third operating voltage is greater than a second operating voltage corresponding to the second region.

2. The flash memory device as claimed in claim 1, wherein the first dielectric layer and the third dielectric layer are surface nitrided oxide layers.

3. The flash memory device as claimed in claim 2, wherein the first dielectric layer and the surface nitrided second dielectric layer are surface nitrided in the same process.

4. The flash memory device as claimed in claim 3, wherein the third dielectric layer and the first dielectric layer are surface nitrided in different processes.

5. The flash memory device as claimed in claim 1, wherein the thickness of the first dielectric layer is greater than the thickness of the third dielectric layer.

6. The flash memory device as claimed in claim 1, wherein both the first dopant and the second dopant are boron.

7. The flash memory device as claimed in claim 1, wherein the first polycrystalline silicon layer and the second polycrystalline silicon layer are formed in different processes.

8. The flash memory device as claimed in claim 1, wherein the bottom surface of the third dielectric layer in the array region is coplanar with the bottom surface of the third dielectric layer in the third region.

9. The flash memory device as claimed in claim 8, wherein the third region is located between the array region and the second region.

10. The flash memory device as claimed in claim 1, wherein a top surface of the first polycrystalline silicon layer in the first region is higher than a top surface of the first polycrystalline silicon layer in the second region.

11. The flash memory device as claimed in claim 10, wherein the top surface of the first polycrystalline silicon layer in the second region is higher than a top surface of the second polycrystalline silicon layer in the array region.

12. The flash memory device as claimed in claim 1, wherein a top surface of the substrate in the array region is lower than a top surface of the substrate in the second region.

13. The flash memory device as claimed in claim 1, wherein a bottom surface of the first dielectric layer is lower than the bottom surface of the surface nitrided second dielectric layer.

14. The flash memory device as claimed in claim 1, wherein the bottom surface of the third dielectric layer is lower than a bottom surface of the first dielectric layer.

15. The flash memory device as claimed in claim 1, wherein the first dielectric layer has a thickness in a range of 10-40 nm.

16. The flash memory device as claimed in claim 1, wherein the surface nitrided second dielectric layer has a thickness in a range of 1-4 nm.

17. The flash memory device as claimed in claim 1, wherein the third dielectric layer has a thickness in a range of 5-9 nm.

* * * * *